United States Patent
Mou

[19]

[11] Patent Number: 6,128,697
[45] Date of Patent: Oct. 3, 2000

[54] SELECTIVELY UPDATEABLE MAPPED DATA STORAGE SYSTEM

[75] Inventor: Yanan Mou, Hsinchu, Taiwan

[73] Assignee: United Microelectronics Corp., Hsinchu, Taiwan

[21] Appl. No.: 09/123,630

[22] Filed: Jul. 28, 1998

[30]     Foreign Application Priority Data

May 4, 1998 [TW] Taiwan ................................. 87106839

[51] Int. Cl.[7] ..................................................... G06F 12/00
[52] U.S. Cl. .............................. 711/108; 365/49; 365/50
[58] Field of Search ..................... 711/108; 365/49–50

[56]                References Cited

U.S. PATENT DOCUMENTS

| | | | |
|---|---|---|---|
| 5,428,759 | 6/1995 | Smith et al. ................................. | 711/3 |
| 5,475,825 | 12/1995 | Yonezawa et al. .......................... | 711/1 |
| 5,574,875 | 11/1996 | Stansfield et al. .......................... | 711/3 |
| 5,682,495 | 10/1997 | Beavers et al. .......................... | 711/207 |
| 5,953,748 | 11/1996 | Riordan .................................... | 711/207 |
| 6,014,732 | 1/2000 | Naffziger ................................. | 711/203 |

*Primary Examiner*—John W. Cabeca
*Assistant Examiner*—Denise Tran
*Attorney, Agent, or Firm*—Thomas, Kayden, Horstemeyer & Risley

[57]                ABSTRACT

A selectively updateable mapped data storage system is provided. The data storage system includes an address decoder two improved CAM blocks, and a converter connected between the two improved CAM blocks. This selectively updateable mapped data storage system can be implemented with a smaller layout space on the chip and consumes less electrical power than the prior art. Moreover, this selectively updateable mapped data storage system allows the selective updating procedure to be easily and more efficiently implemented than through software means. The selectively updateable mapped data storage system is therefore more advantageous and cost-effective to use than the prior art.

13 Claims, 4 Drawing Sheets

SELECTIVELY UPDATEABLE MAPPED DATA STORAGE SYSTEM

CROSS-REFERENCE TO RELATED APPLICATION

This application claims the priority benefit of Taiwan application serial no. 87106839, filed May 4, 1998, the full disclosure of which is incorporated herein by reference.

BACKGROUND OF THE INVENTION

1. Field of the Invention

This invention relates to computer data storage systems, and more particularly, to a selectively updateable mapped data storage system capable of mapping between a first set of data and a second set of data in a one-to-one and only one manner.

2. Description of Related Art

In a conventional computer data storage system, the one-to-one and only one mapping between a first set of data A stored in one memory block and a second set of data B stored in another memory block (i.e., A→B and B→A) is customarily realized by using two content addressable memory (CAM) blocks. An example of such a selectively updateable mapped data storage system is shown in FIGS. 1–2.

FIG. 1 is a schematic block diagram depicting the one-to-one mapping of A→B in a conventional selectively updateable mapped data storage system. As shown, this data storage system includes an address decoder 2, a first CAM block 4 (which includes an array of CAM cells 12, a driver circuit 14, and an I/O sense amplifier 16), and a first RAM block 6 (which includes an array of RAM cells 18 and an I/O sense amplifier 20). Further, an address bus 8 of a number of word lines WL0–WL255 connects the address decoder 2 to the first CAM block 4, and a data bus 10 of a number of signal lines match0–match255 connects the first CAM block 4 to the first RAM block 6. To refresh the contents of the first CAM block 4, the address decoder 2 decodes the address data ADD A(7:0) and then transfers the decoded address data through the address bus 8 (WL0–WL255) to the first CAM block 4, causing the first CAM block 4 to refresh data with DATA A(9:0). After this, the first CAM block 4 generates and transfers a match drive signal through the data bus 10 (match0–match255) to the first RAM block 6, causing the first RAM block 6 to refresh data with data B(8:0) that is mapped to the data stored in the first CAM block 4.

FIG. 2 is a schematic block diagram used to depict the one-to-one mapping of B→A in the conventional selectively updateable mapped data storage system. As shown, the data storage system further includes an address decoder 22, a second CAM block 24 (which includes an array of CAM cells 32, a driver circuit 34, and an I/O sense amplifier 36), and a second RAM block 26 (which includes an array of RAM cells 38 and an I/O sense amplifier 40). Further, an address bus 28 of a number of word lines WL0–WL255 connects the address decoder 22 to the second CAM block 24, and a data bus 30 of a number of signal lines match0–match255 connects the second CAM block 24 to the second RAM block 26. To refresh the contents of the second CAM block 24, the address decoder 22 decodes the address data ADD B(7:0) and then transfers the decoded address data through the address bus 28 (WL0–WL255) to the second CAM block 24, causing the second CAM block 24 to refresh the data with DATA B(8:0). After this, the second CAM block 24 generates and transfers a match drive signal through the data bus 30 (match0–match255) to the second RAM block 26, causing the second RAM block 26 to refresh the data with A(9:0) that is mapped to the data stored in the second CAM block 24.

FIG. 3 is a schematic circuit diagram showing the detailed inside structure of each of the CAM cells in the first and second CAM blocks 4, 24 respectively shown in FIGS. 1 and 2. As shown, each CAM cell is connected to a pair of bit lines bit, $\overline{bit}$, a word line WL, and a signal line match for transferring the match drive signal. In the data storage system of FIG. 1, the two bit lines bit, $\overline{bit}$ are connected to the I/O sense amplifier 16; the word line WL is connected to the address bus 8; and the signal line match is connected to the data bus 10. Each CAM cell is composed of a pair of inverters 42, 44, and five NMOS (N-type metal-oxide semiconductor) transistors 46, 48, 50, 52, 54.

FIG. 4 is a schematic circuit diagram showing the detailed inside structure of each of the RAM cells in the first and second RAM blocks 6, 26 respectively shown in FIGS. 1 and 2. As shown, each RAM cell is connected to a pair of bit lines bitR, $\overline{bitR}$ and a signal line match, which transfers the match drive signal. In the data storage system of FIG. 1, the two bit lines bitR, $\overline{bitR}$ are connected to the I/O sense amplifier 20; and the signal line match is connected to the data bus 10. Each RAM cell is composed of a pair of inverters 56, 58, and two NMOS transistors 60, 62.

FIG. 5 is a schematic circuit diagram showing detailed inside structure of each of the driver circuits 14, 34 respectively shown in FIGS. 1 and 2. As shown, each driver circuit includes a buffer 64 and a PMOS (P-type metal-oxide semiconductor) transistor 66. The buffer 64 is connected to the signal line match. The PMOS transistor 66 is connected to the system voltage $V_{CC}$.

Assume the first data set A has a total of 1024 elements $\{a_0, a_1, \ldots, a_{1023}\}$ and the second data set B has a total of 512 elements $\{b_0, b_1, \ldots, b_{511}\}$. Assume it is desired to map a group of 256 elements in A, for example $\{a_{512}, a_{513}, \ldots, a_{767}\}$, in a one-to-one correspondence to a group of 256 elements in B, for example $\{b_0, b_1, \ldots, b_{255}\}$.

To perform this mapping operation, the data storage system of FIG. 1 first issues an address signal to the address decoder 2 so as to write the data $\{a_{512}, a_{513}, \ldots, a_{767}\}$ to the corresponding CAM cells 12 in the first CAM block 4; meanwhile, the data $\{b_0, b_1, \ldots, b_{255}\}$ are written into the corresponding CAM cells 32 in the second CAM block 24.

In the next step, the data $\{b_0, b_1, \ldots, b_{255}\}$ are written from the CAM cells 12 to the RAM cells 18 shown in FIG. 1; and meanwhile, the data $\{a_{512}, a_{513}, \ldots a_{767}\}$ are written from the CAM cells 32 to the RAM cells 38 shown in FIG. 2.

After that, the first element $\{b_0\}$ can be accessed via the element $\{a_{512}\}$ which is now stored in the CAM cells 12; and vice versa, the element $\{a_{512}\}$ can be accessed via the element $\{b_0\}$ which is now stored in the second CAM block 24. Other elements can be accessed in a similar manner.

When a selective refreshing procedure is requested, for example to change the mapping from $\{b_0\} \to \{a_{512}\}$ to $b_0 \to \{a_{511}\}$, the element $\{a_{512}\}$ stored in the second RAM block 26 can be refreshed by the element $\{b_0\}$ stored in the second CAM block 24, while the element $\{a_{512}\}$ stored in the first CAM block 4 is refreshed by the element $\{a_{511}\}$.

The foregoing conventional data storage system of FIGS. 1–2, however, has two major drawbacks. First, the use of two CAM blocks (i.e., the first CAM block 4 and the second CAM block 24) requires a large layout space on the chip to realize and also causes the chip to consume considerable electrical power, which causes the data storage system to be relatively cost-ineffective to use. Second, in operation the first CAM block 4 should keep track of the addresses where the $\{a_{512}, a_{513}, \ldots a_{767}\}$ are stored, while second CAM block 24 should keep track of the addresses where the $\{b_0, b_1, \ldots b_{255}\}$ are stored; otherwise, the selective refreshing procedure will be impossible to operate. This requirement, however, causes the mapping operation program to be more complex.

SUMMARY OF THE INVENTION

It is therefore an objective of the present invention to provide a new selectively updateable mapped data storage system, which takes up a smaller layout space on the chip as compared to the prior art.

It is another objective of the present invention to provide a new selectively updateable mapped data storage system which has an improved, selectively updateable mapping capability that allows the access to the data stored in the data storage system to be more efficient.

In accordance with the foregoing and other objectives of the present invention, a new selectively updateable mapped data storage system is provided. The selectively updateable mapped data storage system of the invention is designed specifically to be capable of mapping a first set of data to a second set of data. The selectively updateable mapped data storage system comprises: an address decoder for decoding an address signal; a first improved CAM block for storing the first set of data which can be accessed by the decoded address data from the address decoder, the first improved CAM block generating a first match drive signal when a first set of memory data are stored therein; a second improved CAM block for storing the second set of data which can be accessed by the first match drive signal from the first improved CAM block, the second improved CAM block generating a second match drive signal when a second set of memory data are stored therein, the second match drive signal being transferred to the first improved CAM block to access the first set of data, which are mapped to the second set of data; and a converter coupling the first and second improved CAM blocks, to transfer the first and second match drive signals between the first and second improved CAM blocks.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
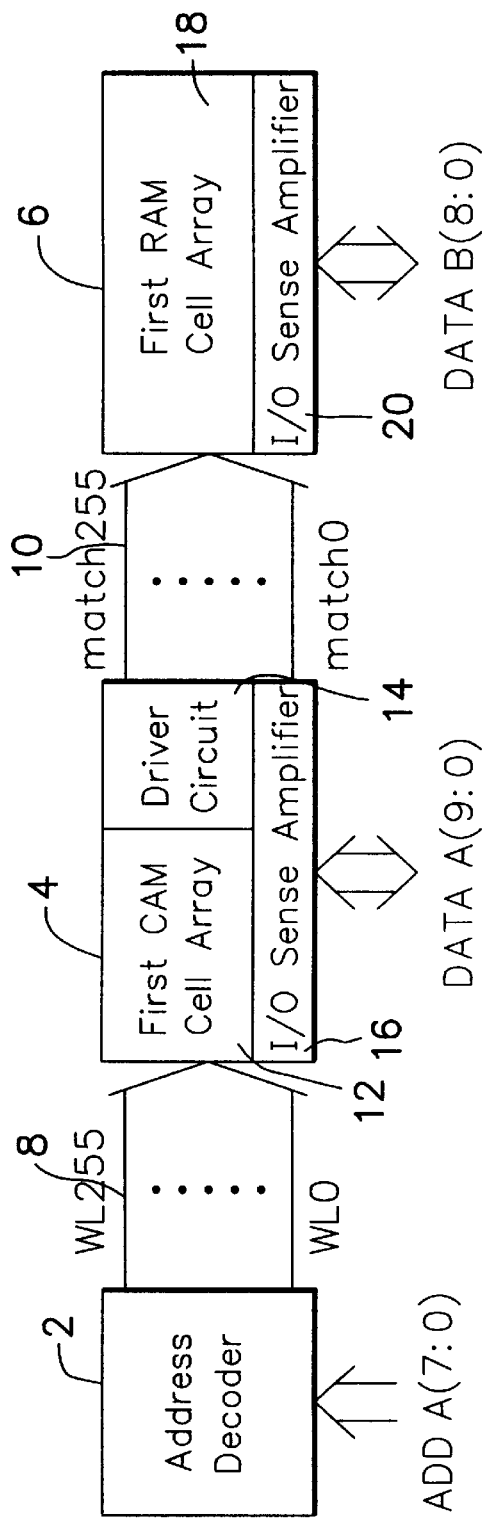
FIG. 1 is a schematic block diagram used to depict the mapping of A→B in a conventional selectively updateable mapped data storage system.
Figure 2:
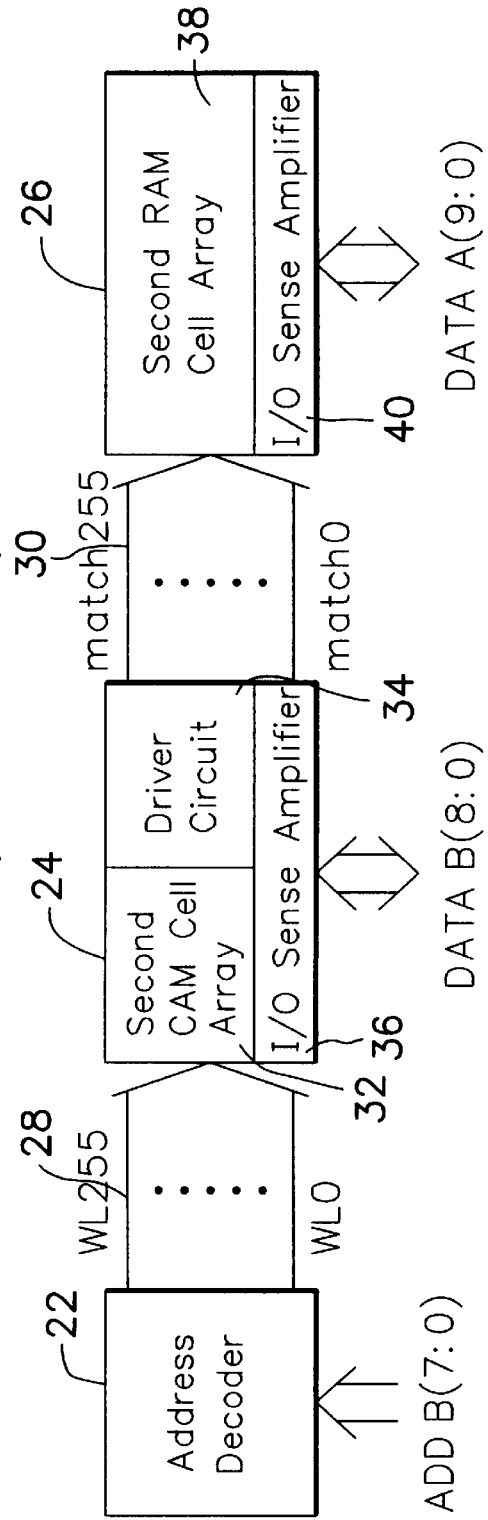
FIG. 2 is a schematic block diagram used to depict the mapping of B→A in a conventional selectively updateable mapped data storage system.
Figure 3:
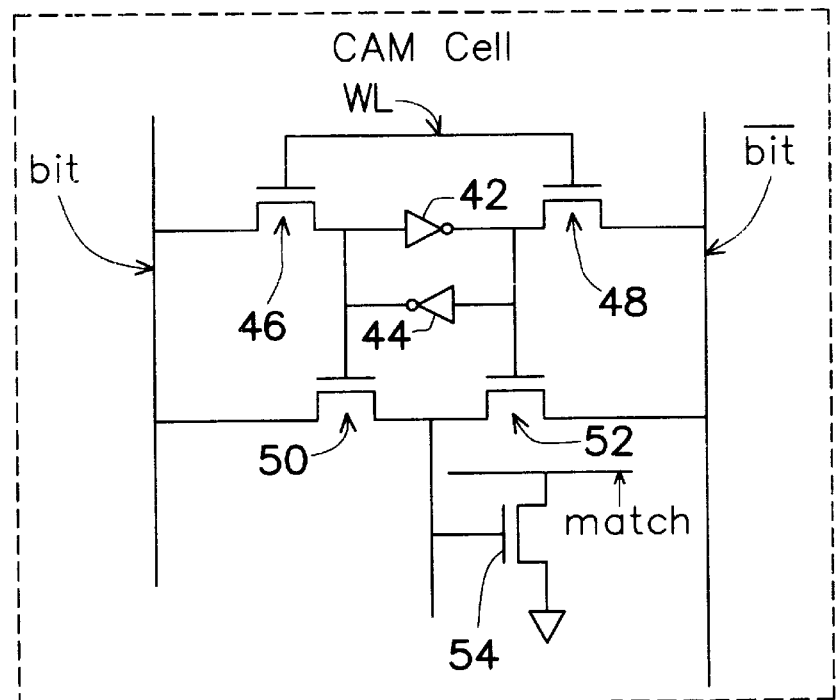
FIG. 3 is a schematic circuit diagram showing detailed inside structure of each of the CAM cells in the CAM blocks shown in FIGS. 1 and 2, respectively.
Figure 4:
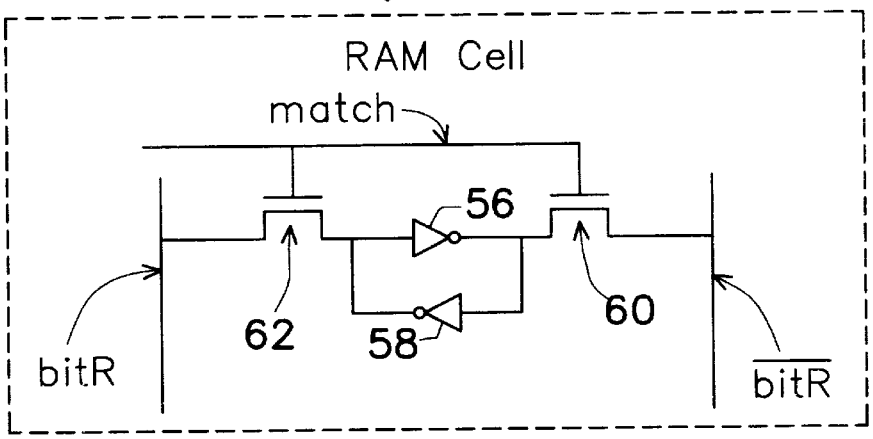
FIG. 4 is a schematic circuit diagram showing detailed inside structure of each of the RAM cells in the RAM blocks shown in FIGS. 1 and 2, respectively.
Figure 5:
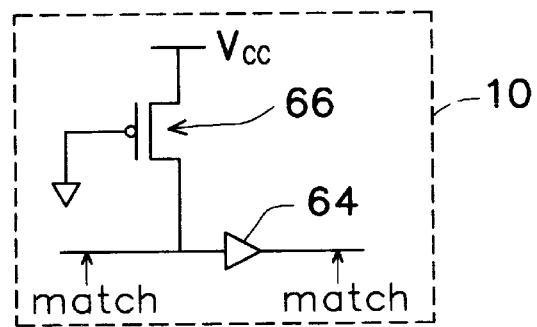
FIG. 5 is a schematic circuit diagram showing detailed inside structure of each of the driver circuits shown in FIGS. 1 and 2, respectively.
Figure 6:
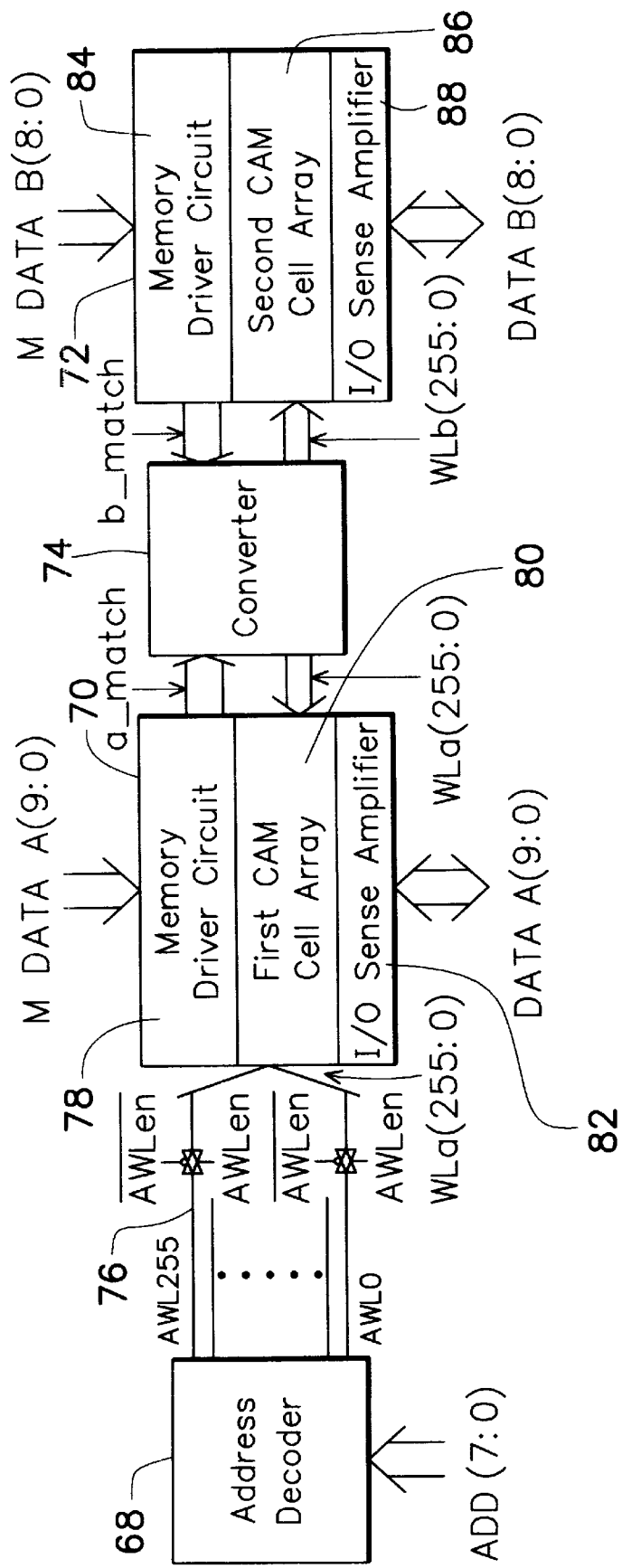
FIG. 6 is a schematic block diagram of the selectively updateable mapped data storage system according to the invention.

FIG. 6 is a schematic block diagram of the selectively updateable mapped data storage system according to the invention. As shown, the data storage system of the invention includes an address decoder 68; a first improved CAM block 70 coupled to the address decoder 68 via a plurality of word lines 76 (AWL0–AWL255); and a second improved CAM block 72 coupled to the first improved CAM block 70 via a converter 74. The first improved CAM block 70 is composed of a driver circuit 78, an array of CAM cells 80, and an I/O sense amplifier 82. In CAM block 70, the driver circuit 78 receives a first set of memory data M DATA A(9:0) and stores it in the CAM cells 80, and the I/O sense amplifier 82 is used for the input/output of a first set of data DATA A(9:0). Similarly, the second improved CAM block 72 is composed of a driver circuit 84, an array of CAM cells 86, and an I/O sense amplifier 88. In CAM block 72, the driver circuit 84 receives a second set of memory data M DATA B(8:0) and stores it in the CAM cells 86, and the I/O sense amplifier 88 is used for the input/output of a second set of data DATA B(8:0).

In operation, the address decoder 68 receives an address signal ADD(7:0). The decoded address data are then transferred through the word lines 76 (AWL0–AWL255) to the first improved CAM block 70, causing the first improved CAM block 70 to store the data from DATA A(9:0) into the corresponding CAM cells 80 in the first improved CAM block 70. After the CAM cells 80 in the first improved CAM block 70 have received the first set of memory data M DATA A(9:0), it outputs a match drive signal through the a_match bus to the converter 74, causing the converter 74 to enable the word lines WLb(255:0) to gain access to DATA B(8:0) stored in the corresponding CAM cells 86 in the second improved CAM block 72. After the CAM cells 86 in the second improved CAM block 72 have received the memory data M DATA B(8:0), it outputs a match drive signal through the b_match bus to the converter 74, causing the converter 74 to enable the word lines WLa(255:0) to gain access to DATA A(9:0) stored in the CAM cells 80 in the first improved CAM block 70.

Figure 7:
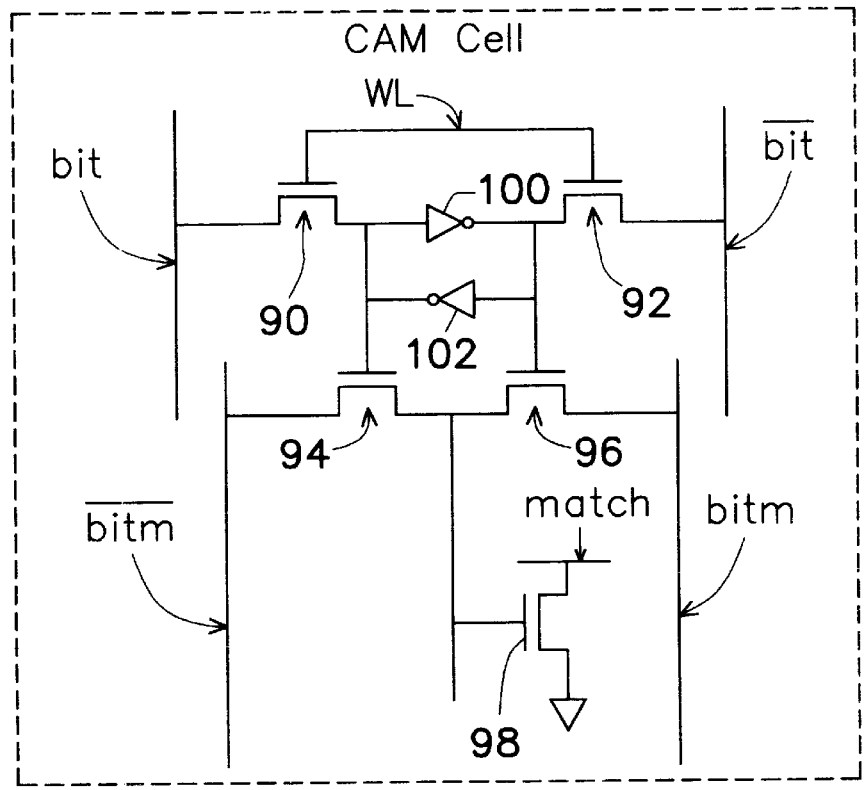
FIG. 7 is a schematic circuit diagram showing detailed inside structure of each of the CAM cells in the first and second improved CAM blocks shown in FIG. 6.

FIG. 7 is a schematic circuit diagram showing the detailed inside structure of each of the CAM cells 80, 86 in the first and second improved CAM blocks 70, 72 shown in FIG. 6. As shown, each CAM cell is composed of five NMOS transistors 90, 92, 94, 96, 98 and a pair of inverters 100, 102, and is connected to a pair of I/O bit lines bit/$\overline{\text{bit}}$ (which are connected to the I/O sense amplifier 82/88), a pair of memory bit lines bitm/$\overline{\text{bitm}}$ (which are connected to the driver circuit 78/84), a word line WL. (which is connected to the word lines 76) and a signal line match (which is connected to the a_match/b_match bus). The two I/O bit lines bit/$\overline{\text{bit}}$ are used for data access and refreshing, while the two memory bit lines bitm/$\overline{\text{bitm}}$ are used for data mapping.

The first NMOS transistor 90 is connected in such a manner that its gate is connected to the word line WL. its first source/drain end is connected to the I/O bit line bit and its second source/drain end is connected to a first node connected in turn to the input end of the first inverter 100, the output end of the second inverter 102, and the gate of the third NMOS transistor 94.

The second NMOS transistor 92 is connected in such a manner that its gate is connected to the word line WL. Its first source/drain end is connected to a second node connected to the output end of the first inverter 100, the input end of the second inverter 102, and the gate of the fourth NMOS transistor 96. Its second source/drain end is connected to the complementary I/O bit line $\overline{bit}$.

The third NMOS transistor 94 is connected in such a manner that its gate is connected to the first node, which is connected to the second source/drain end of the first NMOS transistor 90, the input end of the first inverter 100, and the output end of the second inverter 102. The first source/drain end of the third NMOS transistor 94 is connected to the complementary memory bit line $\overline{bitm}$, and its second source/drain end is connected to a third node connected to both the first source/drain end of the fourth NMOS transistor 96 and the gate of the fifth NMOS transistor 98.

The fourth NMOS transistor 96 is connected in such a manner that its gate is connected to all of the first source/drain end of the second NMOS transistor 92, the output end of the first inverter 100, and the input end of the second inverter 102. Its first source/drain end is connected to the third node, which is connected to both the second source/drain end of the third NMOS transistor 94 and the gate of the fifth NMOS transistor 98. Its second source/drain end is connected to the memory bit line bitm.

The fifth NMOS transistor 98 is connected in such a manner that its gate is connected to the third node which is connected to both the second source/drain end of the third NMOS transistor 94 and the first source/drain end of the fourth NMOS transistor 96. Its drain is connected to the signal line match. Its source is connected to the ground.

Figure 8:
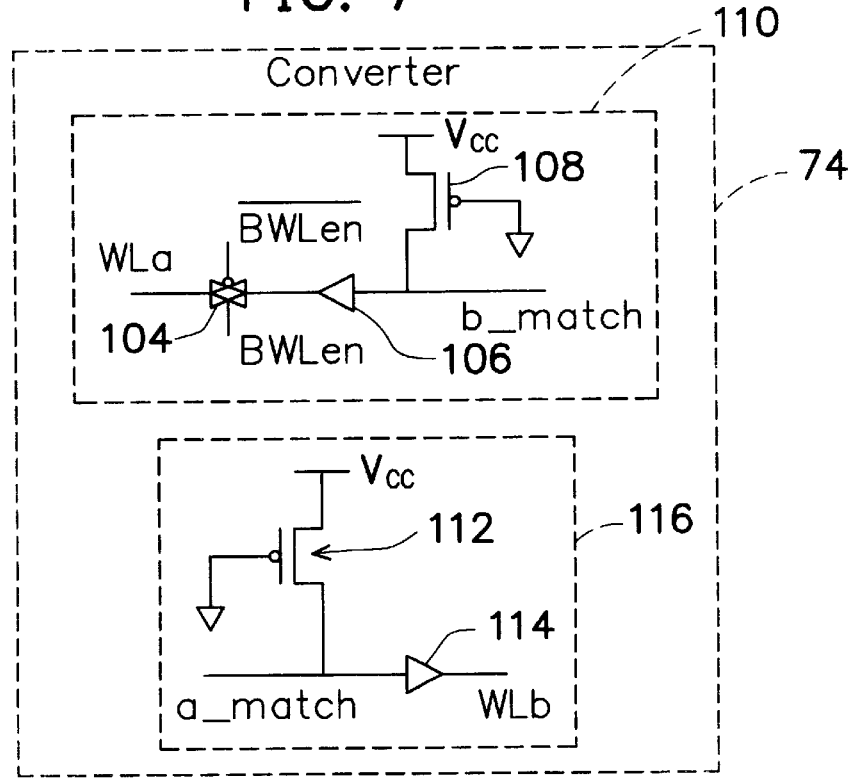
FIG. 8 is a schematic circuit diagram showing detailed inside structure of the converter shown in FIG. 6.

FIG. 8 is a schematic circuit diagram showing the detailed inside structure of the converter 74 shown in FIG. 6. As shown, the converter 74 is composed of a first converting circuit 110 and a second converting circuit 116.

The first converting circuit 110 is composed of a pseudo switch 104, a buffer 106, and a PMOS transistor 108. The pseudo switch 104 is controlled by BWLen/$\overline{BWLen}$ and has one end connected via the word line WLa to the CAM cells 80 in the first improved CAM block 70 (FIG. 6) and the other end connected to the output end of the buffer 106. The PMOS transistor 108 is connected in such a manner that its gate is connected to the ground, its source is connected to the system voltage $V_{CC}$, and its drain is connected via the signal line b_match to the CAM cells 86 in the second improved CAM block 72 (FIG. 6) and also to the input end of the buffer 106.

The second converting circuit 116 is composed of a PMOS transistor 112 and a buffer 114. The buffer 114 is connected in such a manner that its input end is connected via the signal line a_match to the CAM cells 80 of the first improved CAM block 70 (FIG. 6). Its output end is connected via the word line WLb to the CAM cells 86 in the second improved CAM block 72 (FIG. 6). The PMOS transistor 112 is connected in such a manner that its gate is connected to the ground, its source is connected to the system voltage $V_{CC}$, and its drain is connected to the signal line a_match and also to the input end of the buffer 114.

In the following, the same example that was described in the background section of this specification will be used again to explain the operation of the selectively updateable mapped data storage system of the invention. That is, assume the first data set A has a total of 1024 elements $\{a_0, a_1, \ldots a_{1023}\}$ and the second data set B has a total of 512 elements $\{b_0, b_1, \ldots b_{511}\}$ and assume it is desired to map the 256 elements $\{a_{512}, a_{513}, \ldots, a_{767}\}$ in A to the 256 elements $\{b_0, b_1, \ldots b_{255}\}$ in B.

To perform the foregoing mapping by the data storage system of FIG. 6, the first step is to write the data $\{a_{512}, a_{513}, \ldots, a_{767}\}$ by using the address decoder 68, into corresponding CAM cells 80 in the first improved CAM block 70. Meanwhile, the data $\{b_0, b_1, \ldots b_{255}\}$ are written through the CAM cells 80 to corresponding CAM cells 86 in the second improved CAM block 72.

When it is desired to gain access to the element $\{b_0\}$, the corresponding element $\{a_{512}\}$ is first loaded via M DATA A(9:0) into the CAM cells 80 in the first improved CAM block 70. Once loaded, the CAM cells 80 will generate and transfer a first match drive signal a_match via the a_match bus to the converter 74, causing the converter 74 to enable the corresponding data line in the WLb(255:0) bus connected to the CAM cells 86 in the second improved CAM block 72, thereby retrieving the corresponding element $\{b_0\}$ from the CAM cells 86 in the second improved CAM block 72.

On the other hand, when it is desired to gain access to the element $\{a_{512}\}$, the corresponding element $\{b_0\}$ is first loaded via M DATA B(8:0) into the CAM cells 86 in the second improved CAM block 72. Once loaded, the CAM cells 86 will generate and transfer a second match drive signal b_match via the b_match bus to the converter 74. This causes the converter 74 to enable the corresponding data line in the WLa(255:0) bus, which is connected to the CAM cells 80 in the first improved CAM block 70, thereby retrieving the corresponding element $\{a_{512}\}$ from the CAM cells 80 in the first improved CAM block 70.

When a selective updating procedure is requested, for example, to change the mapping from $\{b_0\} \rightarrow \{a_{512}\}$ to $\{b_0\} \rightarrow \{a_{511}\}$, the element $\{b_0\}$ is first loaded via M DATA B(8:0) into the CAM cells 86 in the second improved CAM block 72. Meanwhile, the element $\{a_{511}\}$ is loaded via M DATA A(9:0) into the CAM cells 80 in the first improved CAM block 70. This completes the selective refreshing procedure.

The word lines WLa(255:0) on both sides of the first improved CAM block 70 are driven by two respective logic signals AWLen and BWLen (see FIG. 8). Since only one of the first and second improved CAM blocks 70, 72 can be active in operation at any one time, the AWLen and BWLen cannot both be switched to the enabling state (for example, a high-voltage state, or the logic value 1) at the same time. When access to the CAM cells 80 in the first improved CAM block 70 is desired, there are two ways to do this: either via the address decoder 68 or via the CAM cells 86 in the second improved CAM block 72. When accessing via the address decoder 68, the data storage system issues four command codes AWLen=1, $\overline{AWLen}$=0, BWLen=0, and $\overline{BWLen}$=1. The condition of AWLen=1 and $\overline{AWLen}$=0 enables the word lines 76, while the condition of BWLen=0 and $\overline{BWLen}$=1 disables the converter 74. When accessing the first improved CAM block 70 via the second improved CAM block 72, the data storage system issues four command codes AWLen=0, $\overline{AWLen}$=0, BWLen=1, $\overline{BWLen}$=0, bitm=1, and $\overline{bitm}$=1 under the condition of WLb=0. On the other hand, there is only one way to gain access to the second improved CAM block 72, via the first improved CAM block 70. To do this, the data storage system issues AWLen=0, $\overline{AWLen}$=1, BWLen=1, $\overline{\text{BWLen}}$=0, bitm=1, and $\overline{\text{bitm}}$=1 under the condition of WLa=0.

The operation of the first and second improved CAM blocks 70, 72 includes two phases: a precharging phase and an evaluating phase, which are carried out in a pipeline fashion. When the first improved CAM block 70 is in the precharging phase, the second improved CAM block 72 is in the evaluating phase, and when the second improved CAM block 72 is in the precharging phase, the first improved CAM block 70 is in the evaluating phase. During the precharging phase, the I/O bit lines bit/$\overline{\text{bitm}}$ shown in FIG. 7 are at high-voltage logic state, and the memory bit lines bitm/$\overline{\text{bitm}}$ will enable the generation of the match drive signal. During the evaluating phase, the memory bit lines bitm/$\overline{\text{bitm}}$ are at high-voltage logic state. If it is a write operation I/O bit lines bit/$\overline{\text{bitm}}$ are drive with the intended valve, otherwise /O bit lines are not driven.

In conclusion, the selectively updateable mapped data storage system of the invention can be implemented with a smaller layout space on the chip relative to the prior art. Moreover, the invention allows the selective updating procedure to be easily and more efficiently the performed through software means. The invention is therefore more advantageous than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A selectively updateable mapped data storage system capable of mapping between a first set of data and a second set of data in a one-to-one manner, which storage system comprises:

an address decoder for decoding an address signal;

a first improved CAM block for storing the first set of data which can be accessed by the decoded address data from the address decoder, the first improved CAM block generating a first match drive signal when a first set of memory data is stored therein;

a second improved CAM block for storing the second set of data which can be accessed by the first match drive signal from the first improved CAM block, the second improved CAM block generating a second match drive signal when a second set of memory data is stored therein, and the second match drive signal is transferred to the first improved CAM block in order to access the first set of data, which are mapped to the second set of data, and a converter, coupled between the first and second improved CAM blocks, for transferring the first and second match drive signals between the first and second improved CAM blocks.

2. The data storage system of claim 1, wherein the converter comprises:

a first converting circuit for transferring the second match drive signal from the second improved CAM block to the first improved CAM block; and a second converting circuit for transferring the first match drive signal from the first improved CAM block to the second improved CAM block.

3. The data storage system of claim 2, wherein the first converting circuit comprises:

a buffer whose input end is connected to receive the second match drive signal;

a pseudo switch having a first end connected to the output end of the buffer and a second end connected to the second improved CAM block; and a PMOS transistor whose gate is connected to the ground, whose source is connected to a system voltage, and whose drain is connected to the input end of the buffer.

4. The data storage system of claim 2, wherein the second converting circuit comprises:

a buffer whose input end is connected to receive the first match drive signal and whose output end is connected to the second improved CAM block; and a PMOS transistor whose gate is connected to the ground, whose source is connected to a system voltage, and whose drain is connected to the input end of the buffer.

5. The data storage system of claim 1, wherein the first improved CAM block comprises:

a first array of CAM cells;

a first driver circuit having a memory bit line and a complementary memory bit line connected to the first array of CAM cells; and a first I/O sense amplifier having an I/O bit line and a complementary I/O bit line connected to the first array of CAM cells.

6. The data storage system of claim 5, wherein the first array of CAM cells each comprises:

a first NMOS transistor whose gate is connected to the word line, whose first source/drain end is connected to the I/O bit line, and whose second source/drain end is connected to a first node, a second NMOS transistor whose gate is connected to the word line, whose first source/drain end is connected to a second node, and whose second source/drain end is connected to the complementary I/O bit line;

a first inverter whose input end is connected to the first node and whose output end is connected to the second node;

a second inverter whose input end is connected to the second node and whose output end is connected to the first node;

a third NMOS transistor whose gate is connected to the first node, whose first source/drain end is connected to the complementary memory bit line, and whose second source/drain end is connected to a third node;

a fourth NMOS transistor whose gate is connected to the second node, whose first source/drain end is connected to the third node, and whose second source/drain end is connected to the memory bit line; and a fifth NMOS transistor whose gate is connected to the third node, whose drain is connected to the first match drive signal, and whose source is connected to the ground.

7. The data storage system of claim 5, wherein the second improved CAM block comprises:

a second array of CAM cells;

a second driver circuit having a memory bit line and a complementary memory bit line connected to the second array of CAM cells; and a second I/O sense amplifier having an I/O bit line and a complementary I/O bit line connected to the second array of CAM cells.

8. The data storage system of claim 7, wherein the second array of CAM cells each comprises:

a first NMOS transistor whose gate is connected to the word line, whose first source/drain end is connected to the I/O bit line, and whose second source/drain end is connected to a first node;

a second NMOS transistor whose gate is connected to the word line, whose first source/drain end is connected to a second node, and whose second source/drain end is connected to the complementary I/O bit line;

a first inverter whose input end is connected to the first node and whose output end is connected to the second node;

a second inverter whose input end is connected to the second node and whose output end is connected to the first node;

a third NMOS transistor whose gate is connected to the first node, whose first source/drain end is connected to the complementary memory bit line, and whose second source/drain end is connected to a third node;

a fourth NMOS transistor whose gate is connected to the second node, whose first source/drain end is connected to the third node, and whose second source/drain end is connected to the memory bit line; and a fifth NMOS transistor whose gate is connected to the third node, whose drain is connected to the first match drive signal, and whose source is connected to the ground.

9. A selectively updateable mapped data storage system capable of mapping between a first set of data and a second set of data in a one-to-one manner, which comprises:

an address decoder for decoding an address signal;

a first improved CAM block for storing the first set of data which can be accessed by the decoded address data from the address decoder, the first improved CAM block generating a first match drive signal when a first set of memory data is stored in it, the first improved CAM block including:
 a first array of CAM cells;
 a first driver circuit having a memory bit line and a complementary memory bit line connected to the first array of CAM cells; and
 a first I/O sense amplifier having an I/O bit line and a complementary I/O bit line connected to the first array of CAM cells;

a second improved CAM block for storing the second set of data, wherein the second improved CAM block can be accessed by the first match drive signal from the first improved CAM block, the second improved CAM block generates a second match drive signal when a second set of memory data is stored in it, and the second match drive signal is transferred to the first improved CAM block in order to access the first set of data, which are mapped to the second set of data, the second improved CAM block including:
 a second array of CAM cells;
 a second driver circuit having a memory bit line and a complementary memory bit line connected to the second array of CAM cells; and
 a second I/O sense amplifier having an I/O bit line and a complementary I/O bit line connected to the second array of CAM cells; and a converter, coupled between the first and second improved CAM blocks, for transferring the first and second match drive signals between the first and second improved CAM blocks.

10. The data storage system of claim 9, wherein the converter comprises:

a first converting circuit for transferring the second match drive signal from the second improved CAM block to the first improved CAM block; and a second converting circuit for transferring the first match drive signal from the first improved CAM block to the second improved CAM block.

11. The data storage system of claim 10, wherein the first converting circuit comprises:

a buffer whose input end is connected to receive the second match drive signal;

a pseudo switch having a first end connected to the output end of the buffer and a second end connected to the second improved CAM block; and a PMOS transistor whose gate is connected to the ground, whose source is connected to a system voltage, and whose drain is connected to the input end of the buffer.

12. The data storage system of claim 10, wherein the second converting circuit comprises:

a buffer whose input end is connected to receive the first match drive signal and whose output end is connected to the second improved CAM block, and a PMOS transistor whose gate is connected to the ground, whose source is connected to a system voltage, and whose drain is connected to the input end of the buffer.

13. The data storage system of claim 9, wherein the first and second array of CAM cells each comprises:

a first NMOS transistor whose gate is connected to the word line, whose first source/drain end is connected to the I/O bit line, and whose second source/drain end is connected to a first node, a second NMOS transistor whose gate is connected to the word line, whose first source/drain end is connected to a second node, and whose second source/drain end is connected to the complementary I/O bit line;

a first inverter whose input end is connected to the first node and whose output end is connected to the second node;

a second inverter whose input end is connected to the second node and whose output end is connected to the first node;

a third NMOS transistor whose gate is connected to the first node, whose first source/drain end is connected to the complementary memory bit line, and whose second source/drain end is connected to a third node;

a fourth NMOS transistor whose gate is connected to the second node, whose first source/drain end is connected to the third node, and whose second source/drain end is connected to the memory bit line; and a fifth NMOS transistor whose gate is connected to the third node, whose drain is connected to the first match drive signal, and whose source is connected to the ground.

* * * * *